United States Patent [19]

Moonen et al.

[11] Patent Number: 5,570,019

[45] Date of Patent: Oct. 29, 1996

[54] METHOD FOR MAGNETIC RESONANCE SPECTROSCOPIC IMAGING WITH MULTIPLE SPIN-ECHOES

[75] Inventors: Chrit T. W. Moonen, Silver Spring; Jeff Duyn, Kensington, both of Md.

[73] Assignee: The United States of America as represented by the Department of Health and Human Services, Washington, D.C.

[21] Appl. No.: 538,786

[22] Filed: Oct. 3, 1995

Related U.S. Application Data

[63] Continuation of Ser. No. 106,377, Aug. 13, 1993, abandoned.

[51] Int. Cl.$^6$ .................................................. G01V 3/00
[52] U.S. Cl. .................................... 324/309; 324/307
[58] Field of Search ............................... 324/309, 307, 324/311, 312, 306, 300, 318

[56] References Cited

U.S. PATENT DOCUMENTS

| | | |
|---|---|---|
| 4,628,262 | 12/1986 | Maudsley ................................ 324/309 |
| 4,698,592 | 10/1987 | Feinberg ................................. 324/309 |
| 4,965,520 | 10/1990 | Sakamoto ............................... 324/309 |
| 5,072,182 | 12/1991 | Derby et al. ............................ 324/309 |
| 5,089,784 | 2/1992 | Yoshitome et al. .................... 324/309 |

*Primary Examiner*—Louis M. Arana
*Attorney, Agent, or Firm*—Morgan & Finnegan L.L.P.

[57] ABSTRACT

A nuclear magnetic resonance pulse sequence to provide spectral encoding so that the resulting series of spin-echoes each include both spatial and spectral information for spectroscopic imaging. Atoms within the object are excited and may then be spatially encoded, as by a phase encoding gradient. A series of refocusing pulses is then applied, inducing a respective series of spin-echoes. Spectral information is directly encoded in the spin-echo signals. The multiple spin-echoes may be used for sampling different points of k-space, and/or for increasing the signal-to-noise ratio by averaging. In an alternative embodiment, the present invention produces compound weighted spectroscopic images by selecting the period between refocussing pulses according to the coupling constant of a group contained in the compound; thereby, the signal of the selected compounds modulate with a known frequency different for compounds with different coupling constants.

10 Claims, 7 Drawing Sheets

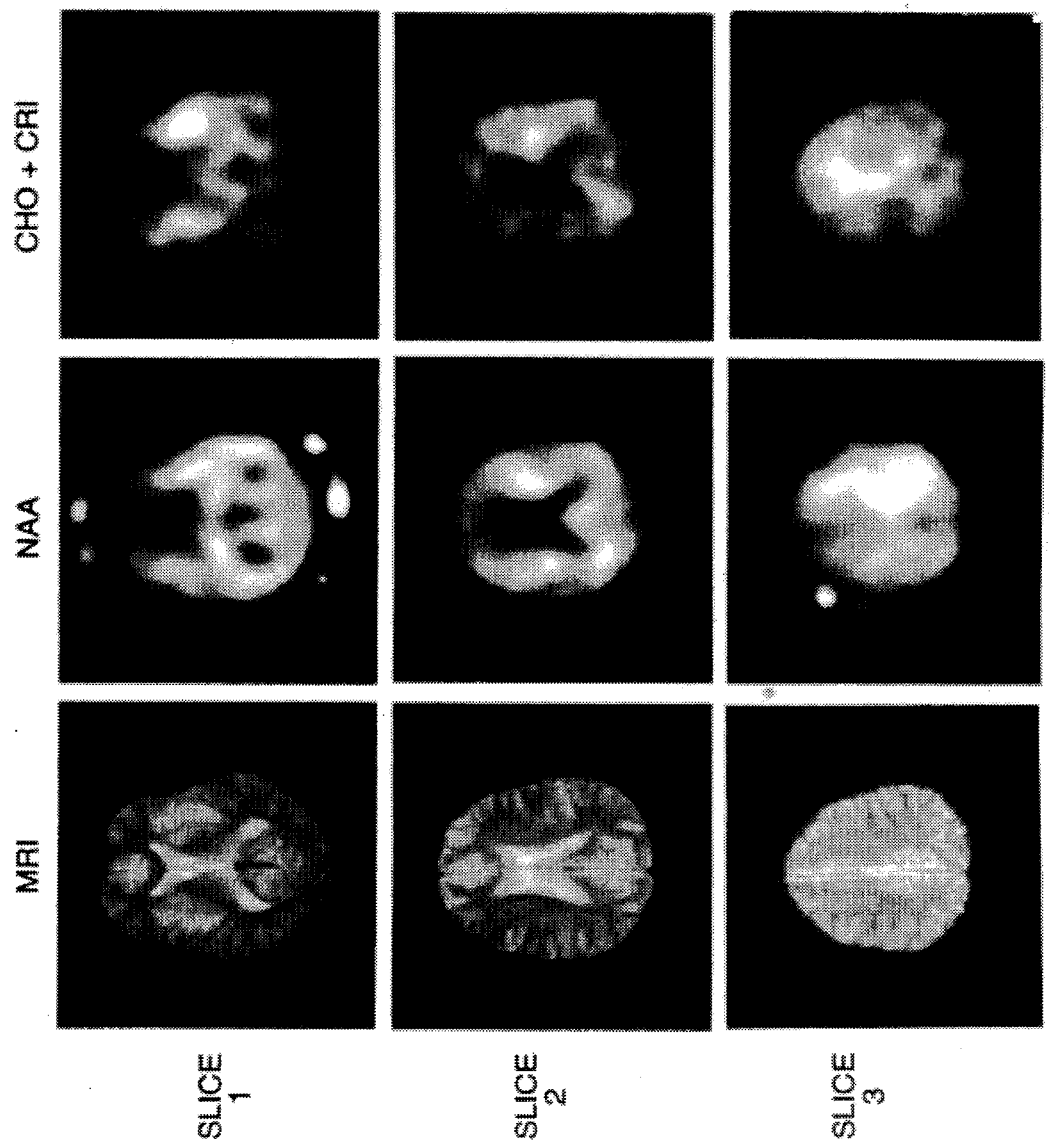

METHOD FOR MAGNETIC RESONANCE SPECTROSCOPIC IMAGING WITH MULTIPLE SPIN-ECHOES

This continuation of application Ser. No. 08/106,377filed on Aug. 13, 1993, now abandoned.

BACKGROUND OF THE INVENTION

The present invention relates generally to the acquisition of nuclear magnetic resonance data and, more particularly, to a method for rapidly acquiring spectroscopic magnetic resonance information from which a spectroscopic image may be formed.

Nuclear magnetic resonance (NMR) techniques have long been used to obtain spectroscopic information about substances, revealing the substance's chemical composition. More recently, spectroscopic imaging techniques have been developed which combine magnetic resonance imaging (MRI) techniques with NMR spectroscopic techniques. Spectroscopic imaging techniques provide a spatial image of the chemical composition.

In recent years there has been increasing interest in the study of brain metabolism using proton MR spectroscopy and spectroscopic imaging because of its noninvasive assessment of regional biochemistry. While proton spectroscopy measures metabolite levels in a single volume, proton spectroscopic imaging (HSI) measures the spatial distribution of metabolites (e.g., N-acetylaspartate (NAA), total choline, total creatine, and lactate) over a predetermined volume of interest (VOI). HSI studies of diseased brain have shown locally altered metabolite levels in chronic and acute brain infarction, multiple sclerosis, epilepsy, brain tumors, and acquired immunodeficiency syndrome.

Spectroscopic imaging inherently requires that the pulse sequence encodes spectral information in addition to spatial information. Thus, a central problem in spectroscopic imaging is the encoding of the spectral information. For example, to perform Fourier imaging, in which the spatial image is ultimately obtained by taking a Fourier transform, the pulse sequence (i.e., both RF pulses an gradient field pulses) shown in FIG. 1 may be used. During interval 1, a 90° excitation pulse is applied in the presence of gradient $G_z$ applied along the z axis. This combination excites the atoms in a single slice of an object causing the atoms of that slice to begin to decay from an excited state. As the spins of the atoms decay or evolve, a reversed gradient $G_z$ is applied during interval 2 and phase encoding gradients $G_x$ and $G_y$ are applied during intervals 2 and 3. Gradients $G_x$ and $G_y$ provide an encoding according to the location of the atoms in the selected slice. During interval 4, a 180° refocusing pulse is applied, after which, during interval 5, a spin echo is received and sampled. A data set is built up by applying a number of combinations of the values of $G_x$ and $G_y$, and the spin echoes of this data set may then be transformed together through a 5 three-dimensional Fourier transform to provide a spectroscopic image of the x-y plane in which the third dimension shows the high resolution spectrum, as explained below. The spatial resolution can be increased by sampling a large number of spin echo signals of increasing magnitudes of the phase encoding gradients $G_x$ and $G_y$.

In the example shown in FIG. 1, the spectral information is encoded directly in the spin echo, and emerges when a Fourier transform of the spin echo is taken. Each chemical compound of a specific element will have one or more characteristic resonances offset in frequency from the basic resonance of that element. Therefore, the frequencies contained in the spin echo will correspond to the compounds of the element being imaged. When a Fourier transform of the spin echo is taken, the resulting spectrum will have a peak corresponding to each compound, the amplitude of the peak reflecting the concentration of that compound. If a data set containing several spin echoes as described above is transformed, an image showing the high resolution spectrum at each location will be produced, showing the concentrations of the compounds at each spatial location.

FIG. 2 illustrates an alternative technique for encoding the spectral information, in which a selective 90° excitation pulse is similarly applied in the presence of gradient $G_z$ during interval 1. Then, during interval 2, gradient $G_z$ is reversed, and during intervals 2 and 3, phase encoding gradient $G_y$ is applied. Also during intervals 2 and 3, an initial prephasing pulse gradient $G_x$ is applied in preparation for applying $G_x$ as an observation gradient during the spin echoes. During interval 4, the 180° refocusing pulse is applied. During interval 5, the observation gradient $G_x$ is again applied for a time period which is centered around the center point of the sampling period of the spin echo. As shown in FIG. 2, several different values of gradient $G_y$ are applied in the Fourier method of imaging to obtain a data set to be transformed.

To encode the spectral information in the sequence of FIG. 2, the timing of the 180° pulse may be changed by an increment dt, as shown in rf sequence (b). This introduces a phase error for all spins which are not resonating at a frequency equal to the detection reference frequency, and the phase error is proportional to the frequency offset, resulting in a phase encoding of the spectral information.

The above methods for obtaining spectral information each require a large number of data acquisition sequences or shots, each beginning with an excitation, typically a selective 90° excitation pulse, followed by a phase encoding interval, an echo generating waveform such as a refocusing pulse, and a spin echo sampling interval. The delay between sequence or shots is typically relatively long in relation to the length of each sequence. As a result, spectroscopic magnetic resonance techniques using conventional equipment have usually been restricted to imaging small volumes or small areas.

For example, most existing HSI techniques for human brain are based on preselection of a volume of interest (VOI) within the skull in order to reduce the undesirable resonances of water and lipid originating from areas outside the VOI. This preselection is generally achieved by a double spin echo technique or a stimulated echo technique. One or two dimensions of gradient phase encoding are employed to spatially discriminate within the VOI. Most recently, the HSI experiment has been extended to three dimensions of phase encoding, allowing the VOI to extend in all three dimensions and thereby obtaining metabolic information from a larger brain volume. Due to the large number of phase encoding steps in this experiment, the clinical limitation on the total measurement time becomes a severe restriction. For example, an experiment with 16×16×12 phase encoding steps and a repetition time (TR) of 2 seconds would require 1.5 hour of total measurement time. In the case of severely ill or instable patients, such study lengths are prohibitive. Therefore, it would be advantageous if more than one spin echo could be sampled for spectral information in each data acquisition sequence.

Techniques used in other areas of NMR gather data from a series of echoes. For instance, multiple spin-echoes per excitation pulse have been used in conventional imaging. Also, echo-planar techniques employ a pulse sequence which samples the entire k-space by a series of gradient reversals following only one excitation pulse; however, this method requires equipment modification to permit rapid gradient reversals so that all the samples are acquired within the transverse relaxation time. (Stehling et al., *Science*, 250, 53–60, (1990)). P. Mansfield, "Spatial Mapping of the Chemical Shift in NMR", J. of Physics D: Applied Physics, vol. 16 (1983), pp. L235–L238, discusses the application of echo-planar NMR imaging methods to the mapping of chemical shift data spectra. This technique, as noted above, requires equipment modification in order to rapidly reverse the gradient field.

It would be advantageous, however, to have a technique for acquiring NMR information including both spatial and spectral information from a series of echoes without the need for repeated reversal of a magnetic field gradient, which is relatively difficult to achieve in practice. It would also be advantageous to have such a technique which could obtain greater spatial and spectral resolution. Further, since the spectral bandwidth for chemical information is typically only 3–8 ppm, spectroscopic techniques are very sensitive to the deleterious residual effects of switched fields. Moreover, in known spin-echo methods the readout gradient typically has a short duration, thereby limiting spectral resolution. Thus, it would be advantageous to have a spectral encoding technique which does not require a readout gradient.

U.S. Pat. No. 4,628,262 to Maudsley, which is herein incorporated by reference, discloses a method for acquiring a data set for generating a spectroscopic image by generating multiple spin-echoes per excitation pulse by using a series of 180° refocussing pulses. After slice selection, a series of refocussing pulses, each followed by a readout gradient (i.e., $G_x$), is provided with the timing between the refocussing pulse and the readout gradient controlled to produce spectral encoding. Each combination of a refocussing pulse and a readout gradient induces a spin echo signal, and the readout gradient controls the time of occurrence of spin echo signal. Spectral encoding is achieved by displacing the time between at least one refocussing pulse and the readout gradient, thereby phase encoding the spectral information. Evidently, the pulse sequence which generates the spin echo signal also encodes the spectral information. For a given observed bandwidth, the delay interval, dt, must satisfy the Nyquist sampling theorem, and increased spectral resolution is achieved by increasing the number of spin echoes for a given phase encoding gradient $G_y$.

There remains, however, a need for further improvements in spectroscopic NMR techniques.

SUMMARY OF THE INVENTION

The present invention provides a method for acquiring a data set for generating spectroscopic images which is not limited by the disadvantages of the prior art. The invention further provides a method for acquiring spectroscopic information which has high efficiency and high signal-to-noise ratio per unit time. The invention involves the application of a pulse sequence to a conventional magnetic resonance imaging (MRI) apparatus in order to rapidly acquire data for generating spectroscopic images. For each 90 degree excitation pulse that is applied, a plurality of spin echoes are generated by a respective plurality of 180 degree refocussing pulses, and spectroscopic information is directly encoded in the spin echo signals. A pulse sequence for practicing the present invention comprises the steps of: slice selection by the combination of a selective 90 degree RF pulse and a magnetic field gradient, followed by applying a series of refocussing 180 degree RF pulses for stimulating a respective series of spin echoes. Each spin echo is phase encoded according to a series of gradients applied in mutually orthogonal directions, (and orthogonal to the slice selection magnetic field gradient), for encoding according to the location of the atoms in the selected slice. A spectroscopic image is obtained by performing a Fourier transform of the acquired spin echo data over k-space, wherein the spectroscopic information is directly encoded in the time domain spin echo signals. Another embodiment of the present invention produces compound weighted spectroscopic images by selecting the period between refocussing pulses according to the coupling constant of a group contained in the compound; thereby, the signal of the selected compounds modulate with a known frequency different for compounds with different coupling constants.

BRIEF DESCRIPTION OF THE DRAWINGS

The invention will be described in greater detail below by way of reference to the accompanying drawings, wherein:

FIG. 5A shows magnetic resonance images shows magnetic resonance images obtained for an example according to the present invention;

DETAILED DESCRIPTION OF THE PREFERRED EMBODIMENT

Figure 1:
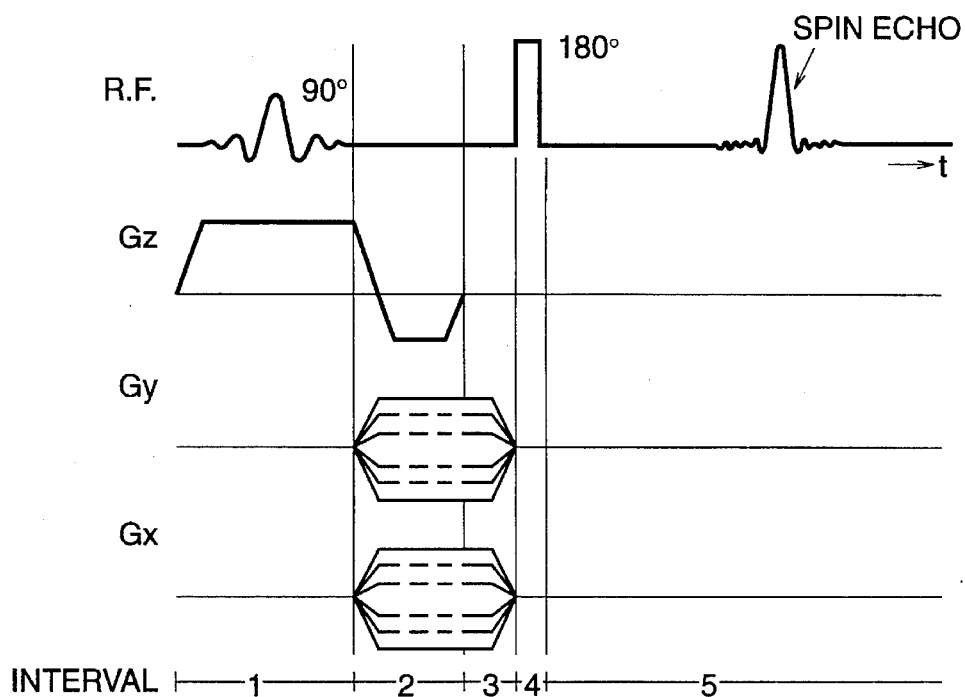
FIG. 1 is a prior art pulse sequence timing diagram for acquiring spectroscopic information.
Figure 2:
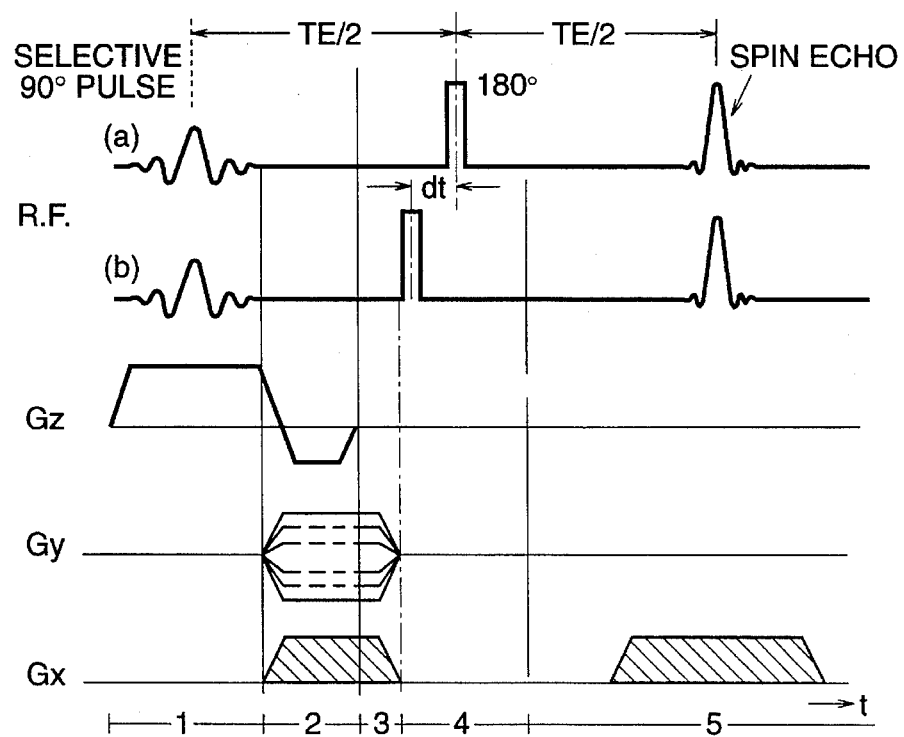
FIG. 2 is another prior art pulse sequence timing diagram for acquiring spectroscopic information.

Referring now to the accompanying drawings, wherein like reference characters refer to like parts throughout the various views, there are shown in FIGS. 1–8 the preferred embodiments of the method for acquiring NMR information, according to the present invention. All references cited hereinabove and hereinbelow are incorporated by reference.

Figure 3:
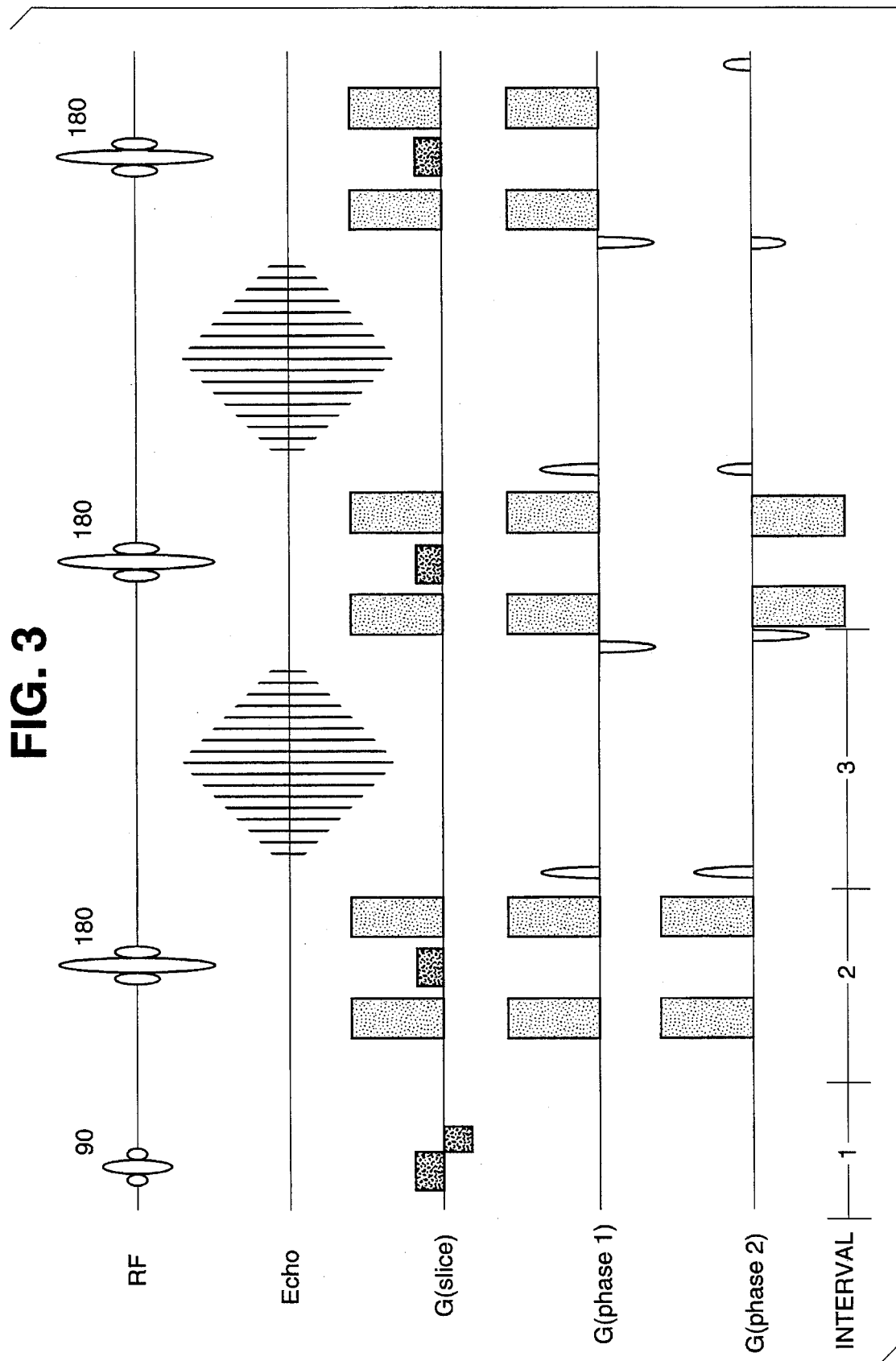
FIG. 3 is a pulse sequence for acquiring spectroscopic information, according to the present invention.

FIG. 3 shows one embodiment of the pulse and gradient switching sequence of the present invention. The process of acquiring spectroscopic imaging data typically includes several distinct intervals in which specific magnetic fields are applied to the object being imaged. During the first of these intervals, designated interval 1, a group of atoms is excited. A slice selecting gradient field $G_{(slice)}$ is applied along the z axis during interval 1, and a selective 90 degree excitation pulse is applied during $G_{(slice)}$, causing the atoms in a selected slice of the object to be excited. From this excited state, the atoms begin to decay according to the well-known time constants $T_1$ (spin-lattice relaxation time) and $T_2$ (spin-spin relaxation time). During the initial decay, also known as the free induction decay (FID), a negative gradient is applied along the z axis to reverse the dephasing caused by the gradient $G_z$ after the center of the excitation pulse applied during interval 1.

During interval 2, a 180 degree refocussing pulse is applied for refocussing the excited spins to induce the spin echo shown in interval 3. In conjunction with the refocussing pulse, a slice selection gradient is applied to select approximately the same slice as in interval 1.

During interval 3, first spatial encoding gradients (i.e., $G_{(phase\ 1)}$ and $G_{(phase\ 2)}$ may be applied, as shown, along the x and y axes, in order to phase encode the spatial information of the selected slice (i.e., sample a point of k-space). The induced spin-echo is then acquired without the application of any further gradient fields. Thus, the spin-echo is directly encoded with spectroscopic information according to the chemical shifts found in the selected slice. Then, in interval 4, gradients may be applied along the x and y directions with an integrated intensity equal to the previously applied phase encode gradients, but in opposite direction, in order to cancel (i.e., rewind) the phase.

In accordance with the present invention, as shown in FIG. 3, after the first spin-echo is acquired, at least 0 one other refocussing pulse is applied for inducing at least one additional spin-echo. Each spin-echo is associated with phase-encode gradients. Preferably, in order to maximize the data acquisition rate each spin-echo samples a separate point of k-space; however, more than one spin-echo can sample the same k-space point, for example, to increase the signal-to-noise ratio.

Ancillary pulse sequences (i.e., shaded gradient pulses) are applied for dephasing undesired magnetization and preventing unwanted stimulated echoes or gradient echoes.

In sum, multiple spin echo signals are acquired for each excitation pulse, wherein the spectroscopic information is directly encoded in the spin echo signals, thereby increasing the spin echo acquisition rate. Once a complete data set is acquired, a three-dimensional Fourier transform yields a spectroscopic image for the selected slice.

The number of spin echoes that may be induced after a given excitation pulse is limited by the spin-spin relaxation time $T_2$, which varies for different media. In practice, the frequency of the refocussing pulses is dependent on the field homogeneity of the medium. For instance, a large field homogeneity increases the dephasing of the excited spins, and thus, the refocussing pulse frequency should be increased. It is not necessary to wait for the spin-echo signal to decay completely before applying subsequent refocussing pulses. In fact, a repetition schemed with a period of approximately one $T2^*$ value or less may be employed.

In a further embodiment of the present invention, the pulse sequence of FIG. 3 is adapted to acquire a specific compound weighted signal based on the property that the phase of acquired signal will modulate when using a period between refocusing pulses that is determined by the coupling constant of a particular group which makes up the compound. For example, this embodiment has been used to separate fat signals from lactate signals, yielding a lactate weighted signal, by using a period of 136 msec between refocussing pulses which enhances the sensitivity to lactate compounds. For the lactate, the 136 msec period is based on the coupling constant of the lactate methyl group.

The following example is presented to illustrate features and characteristics of the present invention which is not to be construed as being limited thereto.

Example

Measurements were performed on a normal volunteer using a conventional 1.5 T GE/SIGNA whole-body scanner (GE Medical Systems, Milwaukee) with 10 mT/m actively shielded gradients and a standard quadrature head coil. The multi-spin-echo sequence consisted (FIGS. 4A and 4B) of three parts: a chemical shift selective saturation (CHESS) sequence for water suppression, a multi-slice outer volume suppression (OVS), and a multi spin-echo spectroscopic imaging (SI) sequence in accordance with the present invention. The CHESS sequence was identical as used in a single-echo method reported by J. H. Duyn, et al., *Radiology*, (July 1993), which is expressly incorporated by reference.

The OVS sequence (FIG. 4B) suppresses water and lipid signals from octagonally grouped slices around the VOI, using 8 slice-selective RF pulses ($\alpha 1$–$\alpha 8$). The pulses re combined in two groups of four. The first group suppresses slices left, right, anterior and posterior with respect to the VOI and is followed by a 6 ms gradient crusher. The second group of four pulses suppresses the diagonal oriented slices and is followed by an 8 ms gradient crusher. The crushers have the specific orientation indicated in the diagram in order to minimize creation of coherences. The amplitudes of the RF pulses are fine-tuned to compensate for T1 relaxation. A delay of 6 msec was appended to minimize the effects of short term eddy currents on the spin-echo sequence.

Figure 4A:
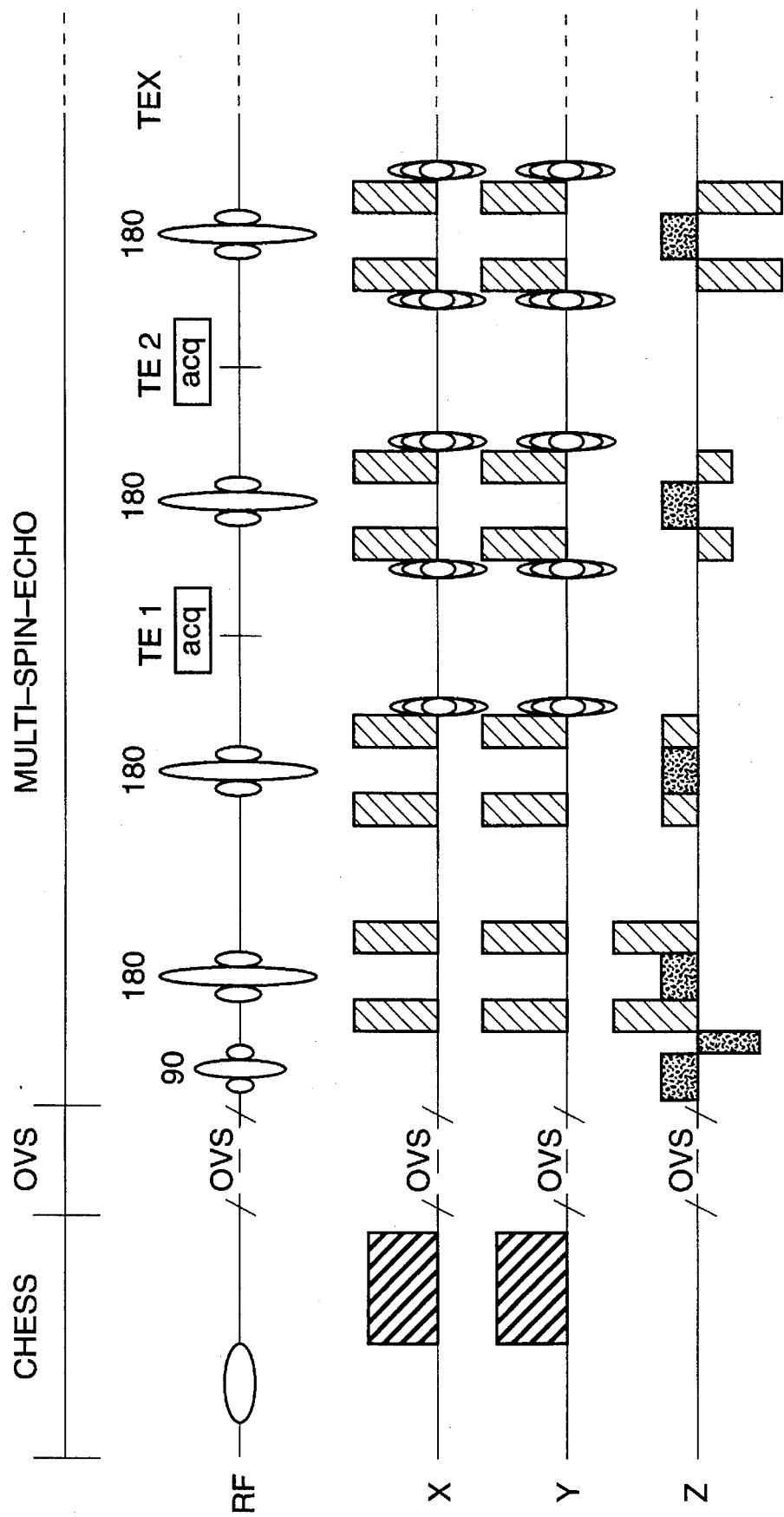
FIG. 4A is a pulse sequence for acquiring spectroscopic information, according to an example of the present invention.
Figure 4B:
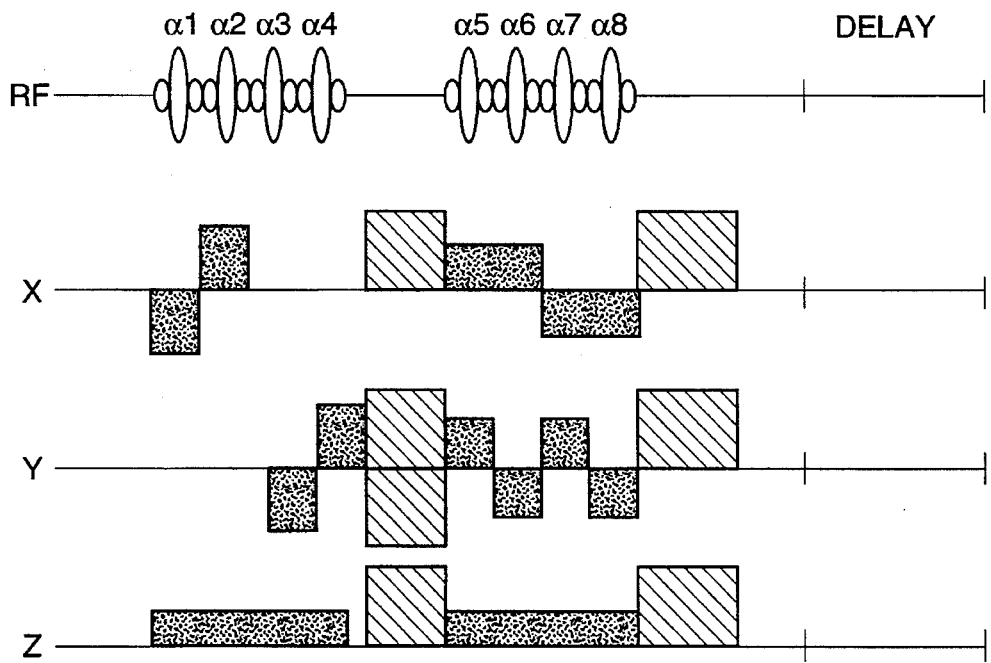
FIG. 4B is a pulse sequence for outer volume suppression used in conjunction with the pulse sequence of FIG. 4A, according to an example of the present invention.
Figure 4C:
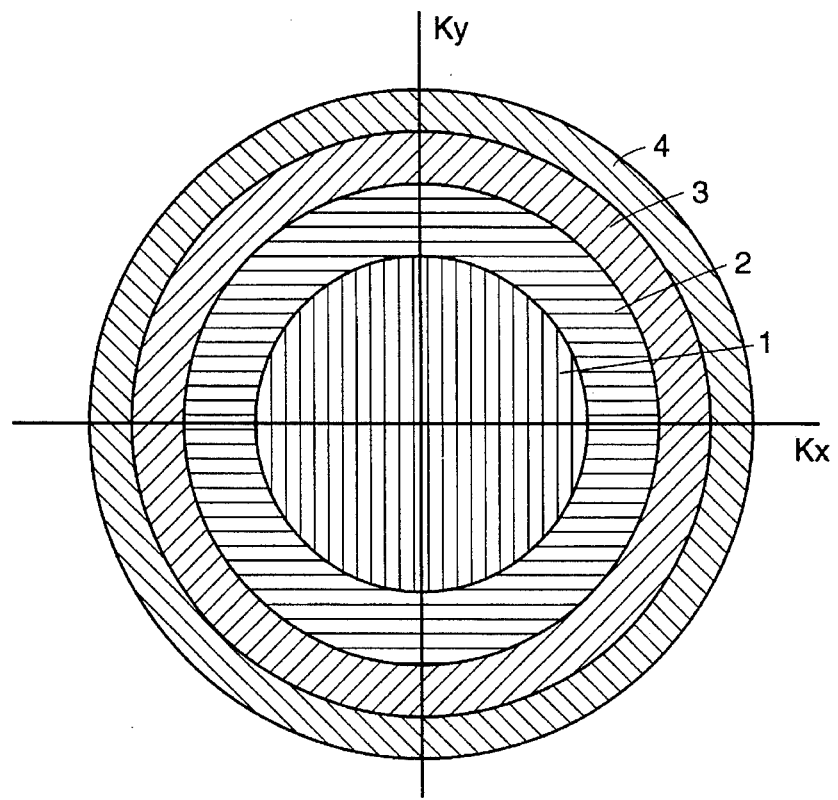
FIG. 4C shows schematically the k-space scanning trajectory according to the phase encoding sequence used in FIG. 4A.

The multi spin-echo sequence acquired 4 spin-echoes at equidistant intervals of 148 ms, the first one occurring at 200 ms. In order to position the first echo at the desired echo time, an additional 180° RF pulse was used. Thus, one slice selective 90° and five slice selective 180° RF pulses were used. The bandwidth of the pulses was 2 kHz. The 180° pulses selected a 10% thicker slice than the 90° RF, resulting in an improved slice profile. The resulting slice profile had a full width at half maximum of 13 mm. A 7 mm slice gap was maintained between adjacent slices. The 180° RF pulses were flanked by 4 ms gradient crusher pulses in x, y, and z direction, the x and y components being each of 10 mT/m strength. The strength of the z-crusher was varied between −9, −3, 3, 9, and −6 mT/m on subsequent crusher pairs in order to suppress stimulated echoes and higher order spin-echoes. Each echo signal was individually phase encoded, applying phase encoding gradients after each 180° RF pulse and using rewinders were to minimize artifacts. A 128 ms echo was symmetrically acquired using a spectral width of 2000 Hz. A 32×32 circular k-space sampling scheme was applied, using a 24 cm×24 cm field of view (FOV). FIG. 4C shows schematically how k-space was scanned by phase encoding each of the spin-echoes. The center of k-space was scanned using the first echo, subsequent echoes scanned higher k-space points. The particular scanning scheme resulted in an effective echo time of 200 ms. During each experiment data during one TR period was acquired without phase encoding gradients in order to provide correction factors for signal losses due to T2 relaxation and to RF pulse angle and slice profile imperfections. Three slices were acquired within a total TR of 2700 ms. The total measurement time was 9 minutes.

Prior to the HSI experiment, axial gradient-echo (GRASS) images were obtained with TE=30 ms, TR=600 ms, to locate the skull/brain interface. On the basis of these images, the VOI was selected and the OVS pulses were positioned. Localized shimming was then performed over the VOI and the RF amplifier output was adjusted using a single spin-echo sequence. The RF pulse amplitude of the CHESS water suppression pulse was adjusted using the multi-echo sequence, by minimizing water signals in the first echo (TE=200 ms). Then the multi-echo HSI experiment was started, and upon completion, a series of axial GRASS MR images was obtained with TE=30 ms, TR=60 ms, using a slice thickness and location corresponding with the HSI images. The total measurement time, including GRASS MRI scans, was 20 minutes. For comparison, a standard single-echo multi-slice acquisition was performed on the same volunteer, with TE=272 ms and slightly modified amplitudes of CHESS and OVS RF pulses. A TR of 2200 ms was chosen, resulting in an amount of $T_1$ weighting similar as in the multi-echo experiment. The total measurement time for the single-echo experiment was 27 minutes.

Data processing was performed off-line on a SUN-SPARC workstation using IDL™ software (Research Systems, Boulder, Colo.). Each slice was processed separately.

For the multi-echo experiment, the four echoes of the reference acquisition without phase encoding gradients were apodized with a 10% Hamming filter and Fourier transformed, resulting in total volume spectra acquired by each of the four echoes. The magnitude signals of the NAA resonance were used to calculate correction factors for signal losses due to $T_2$ relaxation and imperfections in RF pulse angle and slice profiles. Signal losses during each 180° RF pulse were in the order of a few percent, and the correction for the combined effects of relaxation and RF pulse angle correspond to an exponential decay constant of 400 ms. The correction factors were applied to data of the phase encoded experiment, after which a 10% Hamming filter was applied in spectral domain, and a radial cosine filter in spatial domain (two-dimensional filter). The data matrix was then zero-filled eight times in spectral domain, and Fourier transformed in all three dimensions. The resulting effective in-plane spatial resolution was 1.3 cm, as calculated from the contour of the 2-dimensional point spread function (PSF) at half maximum height, and included effects of the circular k-space sampling scheme. Spectra were corrected for $B_o$ inhomogeneities by referencing to the position of NAA. In case of NAA being below an optional threshold, its position was copied from neighbouring voxels. Metabolite images of NAA, and choline +creatine were created by integrating the spectra between 1.9 and 2.1 and between 2.9 ppm and 3.3 ppm frequency regions respectively.

For the standard single-echo multi-slice experiment, a cosine filter was applied in spectral domain, whereas the spatial domain was filtered identically as the multi-echo data set. Also peak-picking and integration were performed in an identical fashion as with the multi-echo data set.

Figure 5B:
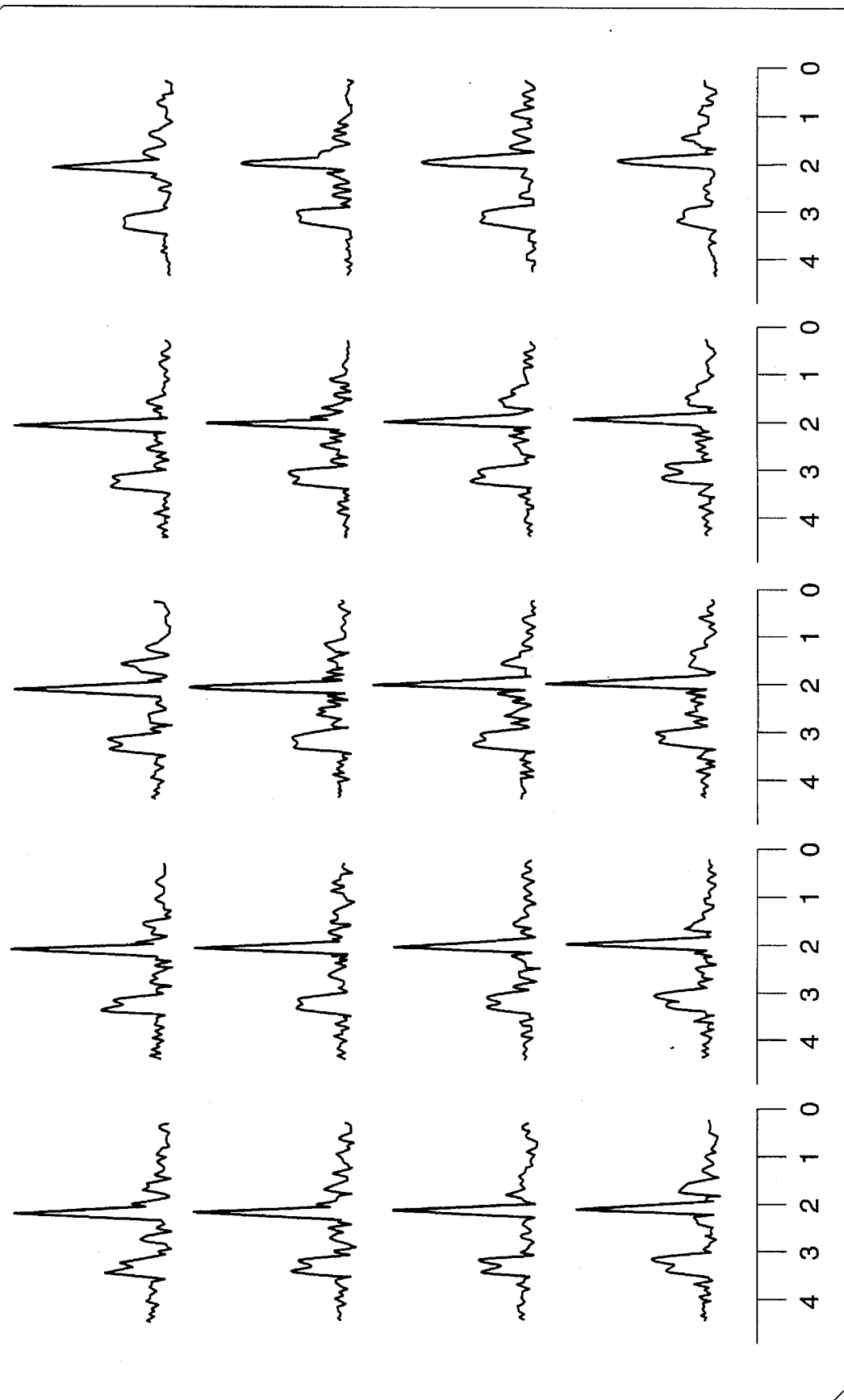
FIG. 5B shows an array of spectra, obtained for an example according to the present invention.
Figure 5C:
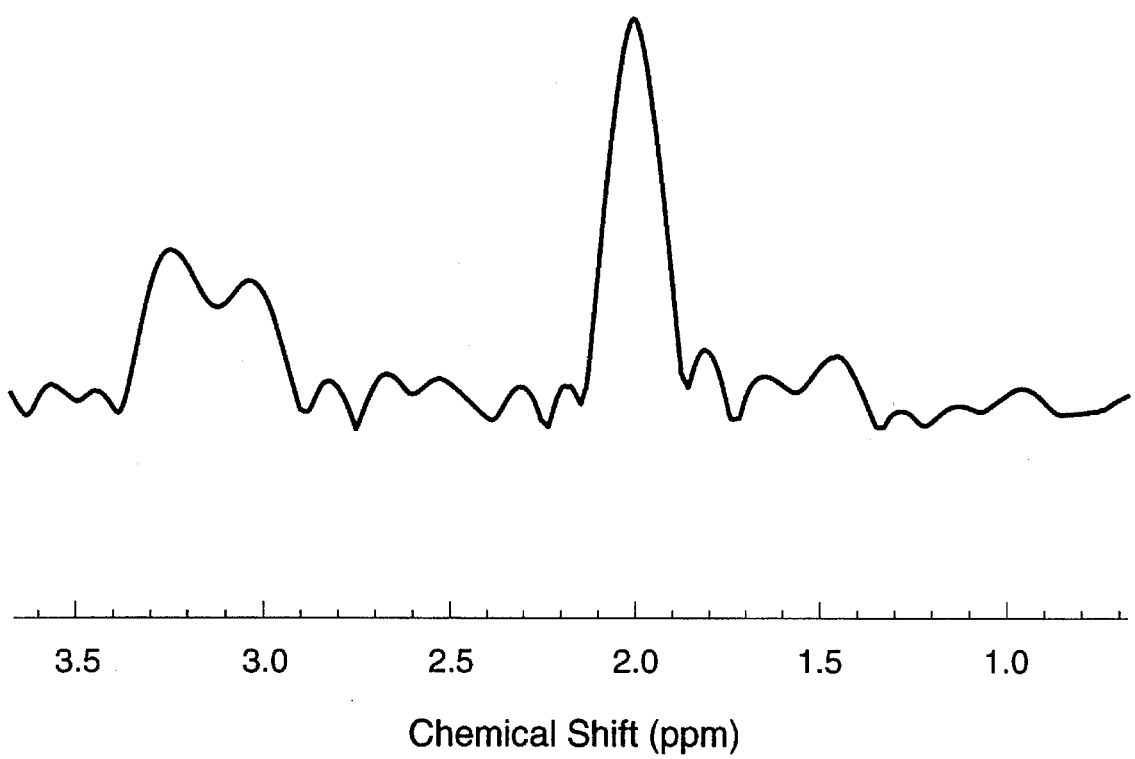
FIG. 5C a spectrum from the array of spectra of FIG. 5B, obtained for an example according to the present invention.

The results of the multi-echo multi-slice experiment are summarized in FIGS. 5A, 5B, and 5C.

FIG. 5A shows, for each of the three slices studied, the spectroscopic images of NAA and total choline total creatine, together with the corresponding GRASS images. Clearly recognizable in the two most inferior slices (top rows) are the ventricular spaces. The bright intensities in the NAA images are insufficiently suppressed signals of lipid from the skull area, which occasionally bleed into brain regions (e.g. slice 1). The bright intensities in the choline+ creatine images from top and bottom slices are caused by remaining water signal.

The SNR in the images of the multi-echo experiment varies between 15 and 20 for the NAA images and between 10 and 15 for choline+creatine images. The spectral quality of the multi-echo experiment is demonstrated in FIG. 5B, which shows an array of spectra extracted from a region just left of the ventricles in slice 2. An individual spectrum is taken from this array (second from left in top row) and displayed in FIG. 5C.

The example presented above demonstrates the advantages of fast spectroscopic imaging using the multi-spin-echo method. In the following a few other aspects of the multi-echo technique are discussed.

An important design criterion in the multi-echo experiment is the number of echoes. A larger number of echoes gives a potentially higher efficiency. Since the total acquisition time (echo duration x number of echoes) is limited by $T_2$, an increased number of echoes is accompanied by a reduced echo duration. Reducing the echo duration below $T_2^*$ (over the voxel), will lead to a reduction in spectral resolution, and only a minimal increase in efficiency. Therefore, the optimum number of echoes, with respect to efficiency and spectral resolution, depends on the ratio $T_2^*/T_2$.

During initial tests of the multi-echo experiment on phantoms artifacts were seen associated with transitions in the signal phase going from one segment in k-space to the next. Most of these artifacts could be explained by eddy current induced residual gradients and $B_o$ shifts, originating from CHESS and OVS gradient crushers, and resulting in an accumulated signal phase at the center of the first acquisition period. This additional phase is inverted in subsequent echoes, leading to the artifacts. For example a net accumulation of 30° phase in the interval between the 90° RF pulse and the first acquisition interval, due to a $B_0$ shift, leads to significant distortion of the PSF. A method used to minimize phase distortions in the echo signals, was to introduce a delay of 6 ms between OVS and spin-echo sequence. Furthermore, the amplitudes of crusher gradients after the 180° RF pulses were fine-tuned to minimize net dephasing at the centers of the acquisition intervals. This was done once for a specific setting of timing variables (TR, delays after CHESS and OVS, TEs) and gradient strengths (crushers, slice selection gradients). Remaining phase differences between echoes were negligible and cause no visible artifacts.

During data processing, each echo was multiplied by a correction factor, to compensate for signal losses due to $T_2$ relaxation and RF pulse imperfections. The correction factor used in our experiments was determined by measuring the NAA signal decay over the four echoes, and corresponded to a $T_2$ of 400 ms. Reports have shown that in normal brain $T_2$ relaxation times of choline, creatine and NAA vary between 200 and 400 ms. Since k-space is scanned in a segmented fashion, inappropriate correction for $T_2$ relaxation effects results in distortion of the spatial PSF. The observed PSF for $T_2$'s between 200 and 800 ms is very similar, and suggests the adequacy of a single correction factor for choline, creatine and NAA. In using this correction, components of lipid resonances with short $T_2$ ($T_2<50$ ms,), have a much broadened PSF with increased sidelobe amplitudes.

As described hereinabove, as a further embodiment of the present invention, lactate weighted imaging may be performed. The lactate signal originates from a coupled methyl doublet, with a phase varying with echo time. In order to measure the doublet in phase, the echo times have to be multiples of 136 ms. For lactate to be measured without localization errors, subsequent echo times have to be separated a multiple of 272 ms. An experiment with echo times of 136, 408, 680 and 952 ms is also possible since lactate has a $T_2$ of around 1200 ms. However, in the later echoes, the other metabolites of interest will be attenuated significantly due to their much shorter $T_2$ values, and will therefore likely have a broadened PSF.

In the experiment discussed above, the increased efficiency of the multi-echo technique was used to reduce the measurement time. Alternatively, the increased efficiency could be used to create $T_2$ maps (by scanning all of k-space with each echo), or to perform a full 3D experiment. For example an experiment with 20×20×12 encoding steps (cylindrical k-space sampling) at TR=2 s will take 30 minutes. Using a 20 cm×20 cm×12 cm an isotropic (nominal) resolution of 1 cm×1 cm×1 cm is achieved.

Thus, as illustrated through the preferred embodiment and the foregoing examples, and as understood by further practicing the present invention, many advantages are provided by the present invention. Data for generating high resolution spectroscopic images may be acquired rapidly. Since spectral information is directly encoded in the spin-echoes, spectral resolution is determined by the echo sampling period. K-space sampling, and concomitantly spatial resolution may be independently controlled and determined by phase encoding gradients $G_x$ and $G_y$. The rate of data acquisition may be increased by increasing the refocussing pulse repetition frequency or increasing the number of spin echoes per excitation pulse. Further, no readout gradients are employed. The method also provides for high efficiency and high SNR per unit time by measuring the signal over a very large part of the T2 decay curve.

Although the above description provides many specificities, these enabling details should not be construed as limiting the scope of the invention, and it will be readily understood by those persons skilled in the art that the present invention is susceptible to many modifications, adaptations, and equivalent implementations without departing from this scope. For example, in the above illustrative example, the increased efficiency of the multiple spin-echo techniques was used for reducing the measurement time. Alternatively, or in combination, the increased efficiency could be used to create T2 maps by scanning all of k-space for each echo time, to acquire a separate part of phase-encode space using additive phase-encode gradients or phase encode rewinders, to increase the signal-to-noise ratio, or to perform a full three-dimensional experiment. For example, as described above, an experiment with 20×20×12 encoding steps (i.e., cylindrical k-space sampling) at TR=2 seconds will take 30 minutes. Using a 20 cm×20 cm×12 cm volume, an isotropic (nominal) resolution of 1 cm×1 cm×1 cm is achieved. Moreover, as can be appreciated from the above illustrative pulse sequence and examples, the present invention may be practiced in conjunction with multi-slice spectroscopic imaging methods, with three-dimensional spectroscopic imaging (e.g., by applying phase-encoding gradients in the slice direction as well), with outer volume suppression techniques, or with time-domain and frequency domain fitting to derive concentrations of various molecules. Further, many variations can be employed for ordering the phase-encoding.

These and other changes can be made without departing from the spirit and the scope of the invention and without diminishing its attendant advantages. It is therefore intended that the present invention is not limited to the disclosed embodiments but should be defined in accordance with the claims which follow.

We claim:

1. A method for acquiring nuclear magnetic resonance information, comprising the steps of:

exciting at least some of the atoms of an object;

providing a plurality of refocusing pulses, each for generating a respective spin echo signal from a common region of the object, successive refocussing pulses separated by a respective refocussing repetition time period, and each of said refocussing pulses associated with a respective phase encoding gradient for individually phase encoding each of the respective spin echo signals to provide spatial information; and receiving, in the absence of an externally applied magnetic field gradient, the respective spin echo signals from the object after at least one of the refocusing pulses.

2. The method according to claim 1, wherein exciting the atoms comprises exciting the atoms of the object by applying at least one excitation pulse to the object.

3. The method according to claim 1, wherein said spin echo signals are directly encoded with spectral information.

4. The method according to claim 1, exciting the atoms further comprising applying a slice selecting magnetic gradient field to the object while applying the excitation pulse, said slice selecting magnetic gradient field being applied in a first direction.

5. The method according to claim 1, further comprising, before receiving said respective spin echo signals, applying a phase encoding magnetic gradient field in a second direction orthogonal to the first direction for spatially encoding the excited atoms in said second direction.

6. The method according to claim 5, further comprising, before receiving said respective spin echo signals, applying a phase encoding magnetic gradient field in a third direction orthogonal to the first direction for spatially encoding the excited atoms in the plane containing said second direction and said third direction.

7. The method according to claim 1, wherein the step of exciting the atoms comprises applying a plurality of excitation pluses to the object; and wherein a plurality of the refocusing pluses are provided after each excitation pulse.

8. The method according to claim 1, wherein said refocussing repetition period is varied depending on the field homogeneity of said object.

9. The method according to claim 1, wherein said refocussing repetition period is varied depending of the coupling constant of a group contained in a component of said object, thereby modulating the phase of said spin-echo.

10. A method of acquiring spectroscopic magnetic resonance imaging information for an object, comprising the steps of:

exciting some of the atoms in the object;

providing a plurality of refocussing pulses for stimulating a respective plurality of spin echo signals from a common region of the object;

selectively generating a plurality of phase encoding gradients in at least two directions for spatially encoding said plurality of spin echo signals to provide spatial information; and receiving, in the absence of an externally applied magnetic field gradient, said spin echo signals, wherein spectroscopic information is directly encoded in said spin echo signal.

* * * * *